United States Patent
Ozaki (10) Patent No.: US 8,701,803 B2
(45) Date of Patent: Apr. 22, 2014

(54) DIAGNOSTIC APPARATUS AND METHOD FOR MOTOR

(75) Inventor: Takayoshi Ozaki, Iwata (JP)

(73) Assignee: NTN Corporation, Osaka (JP)

( * ) Notice: Subject to any disclaimer, the term of this patent is extended or adjusted under 35 U.S.C. 154(b) by 0 days.

(21) Appl. No.: 14/003,418

(22) PCT Filed: Mar. 5, 2012

(86) PCT No.: PCT/JP2012/055534
§ 371 (c)(1),
(2), (4) Date: Sep. 5, 2013

(87) PCT Pub. No.: WO2012/121200
PCT Pub. Date: Sep. 13, 2012

(65) Prior Publication Data
US 2013/0341109 A1 Dec. 26, 2013

(30) Foreign Application Priority Data
Mar. 7, 2011 (JP) ................................. 2011-048633

(51) Int. Cl.
*B60W 20/00* (2006.01)
(52) U.S. Cl.
USPC .................. 180/65.275; 180/65.265; 701/22; 701/31.1; 701/29.1
(58) Field of Classification Search
USPC ...................... 701/22, 84, 99, 101, 29.1, 31.1; 180/65.1–65.31
See application file for complete search history.

(56) References Cited

U.S. PATENT DOCUMENTS

| | | | | |
|---|---|---|---|---|
| 5,156,010 A * | 10/1992 | Inoue et al. | ........................ | 62/81 |
| 7,071,649 B2 * | 7/2006 | Shafer et al. | ................... | 318/783 |
| 7,129,660 B2 * | 10/2006 | Fujita et al. | .................... | 318/434 |
| 7,336,055 B2 * | 2/2008 | Ishishita | ........................ | 320/150 |
| 8,004,246 B2 * | 8/2011 | Liu et al. | ........................ | 320/136 |
| 8,237,411 B2 * | 8/2012 | Liu et al. | ........................ | 320/136 |
| 8,306,692 B2 * | 11/2012 | Ishishita | ......................... | 701/36 |
| 2012/0203408 A1* | 8/2012 | Migita | ........................... | 701/22 |

FOREIGN PATENT DOCUMENTS

| | | |
|---|---|---|
| JP | 6-261404 | 9/1994 |
| JP | 11-262101 | 9/1999 |
| JP | 2005-119647 | 5/2005 |
| JP | 2008-168790 | 7/2008 |
| JP | 2009-207315 | 9/2009 |

OTHER PUBLICATIONS

International Search Report mailed May 22, 2012 in corresponding International Application No. PCT/JP2012/055534.
PCT International Preliminary Report on Patentability mailed Sep. 19, 2013 in corresponding International Application No. PCT/JP2012/055534.

* cited by examiner

*Primary Examiner* — John Walters
*Assistant Examiner* — James Triggs (57) ABSTRACT

A diagnostic apparatus for diagnosing a drive motor of a vehicle includes a start-up abnormality detection section to detect coil temperature, coil resistance or insulation resistance of a motor coil during a non-traveling time in which electric power supply is applied and to determine occurrence of abnormality in the motor coil when the coil temperature is greater than a threshold value or the coil resistance or insulation resistance is greater than a threshold value, and a travel abnormality detection section to detect coil temperature, rotation number of the motor, a motor applied voltage and a motor current during traveling of the vehicle and to determine occurrence of abnormality in the motor coil when the coil temperature is greater than a threshold value or the relation between the motor applied voltage and the motor current relative to the rotation number fails to fall within a predetermined range.

11 Claims, 8 Drawing Sheets

DIAGNOSTIC APPARATUS AND METHOD FOR MOTOR

CROSS REFERENCE TO THE RELATED APPLICATION

This application is a U.S. national stage application of PCT/JP2012/055534 filed Mar. 5, 2012 and claims foreign priority benefit of Japanese Application No. 2011-048633 filed Mar. 7, 2011 in the Japanese Intellectual Property Office, the contents of both of which are incorporated herein by reference.

BACKGROUND OF THE INVENTION

1. Field of the Invention

The present invention relates to an apparatus and a method of diagnosing a motor used in driving a wheel of an electric vehicle and also to a self-diagnosing function of a drive motor.

2. Description of Related Art

In an electric vehicle, malfunction occurring in a motor, which is used to drive a vehicle, and/or a controller used to control the motor markedly affects the performance and safety. In particular, where the electric vehicle makes use of an in-wheel motor drive system, as a result of such device being planned to be downsized, a wheel bearing assembly, a reducer and a motor, all of which are parts of components of the in-wheel motor drive system, are subjected to a high speed operation and, therefore, securement of the reliability of those components is of a prime concern. In connection with the in-wheel motor drive system, suggestions have hitherto been made that in order to secure the reliability during the travel of the vehicle, temperatures of the wheel bearing assembly, the reducer and the motor or the like are measured to monitor the presence or absence of an overload so that in dependence of the temperatures measured, an electric drive current of the motor may be limited and/or the number of revolutions of the motor may be lowered. In this respect, see, for example, the patent document 1 listed below.

PRIOR ART DOCUMENT

[Patent Document 1] JP Laid-open Patent Publication No. 2008-168790

SUMMARY OF THE INVENTION

In the electric vehicle of an in-wheel motor type, a motor having a high responsibility is fitted independently to individual wheels. In particular, where a driving torque of the motor, which forms a drive source of the electric vehicle, is transmitted to the wheel through a reducer having a high reduction ratio, the torque of the motor resulting from an instable motor control is transmitted to the wheel after having been amplified. For this reason, in the event of the trouble occurring in such motor, a support for such situation is needed so that the vehicle can retain a stable posture.

As discussed above, in the in-wheel motor drive system, a drive limitation of the motor has been conducted by monitoring the presence or absence of the overload through the measurement of the temperature of the motor during traveling of the vehicle. In this case, however, it is desirable that a detailed diagnosis is performed during a startup of the vehicle or a non-traveling mode such as, for example, during a period of time with no electric power having yet been supplied to a motor, for example, during a runup prior to the vehicle being started and, in the event of the occurrence of an abnormality in the motor, the vehicle is driven to the nearest repair shop for repair or a vehicle rescue has to be sought for. Also, even when the motor is functioning properly during the period of time prior to the vehicle being started, it may be suspected that during the travel of the vehicle an abnormality will occur in a motor coil.

In view of the foregoing, the present invention has for its primary object to provide an apparatus for diagnosing a motor and a method of diagnosing the motor, both of which are effective to detect the occurrence of an abnormality in a motor coil not only during the travel of a vehicle, but also during a non-traveling period of the vehicle so that a motor abnormality can be quickly handled or dealt with. Hereinafter, the summary of the present invention will be described with the aid of reference numerals employed in the accompanying drawings in connection with a embodiment of the present invention.

The apparatus for diagnosing the motor according to the present invention is a diagnostic apparatus to diagnose a drive motor 6 used in an electric vehicle that has wheels 2 driven by such drive motor 6, including a start-up abnormality detection section 98 to detect a coil temperature of a motor coil 78 and a coil resistance or an insulation resistance of the motor coil 78 during a non-traveling time, in which an electric power supply of a vehicle is applied, and then to detect the occurrence of an abnormality in the motor coil 78 in the event that the coil temperature is greater than a threshold value or the coil resistance or the insulation resistance is greater than a threshold value; and also including a travel abnormality detection section 99 to detect a coil temperature, the rotation number of the drive motor, a motor applied voltage and a motor current during a traveling of the vehicle and then to detect the occurrence of the abnormality in the motor coil 78 in the event that the coil temperature is greater than a threshold value, or a relation between the motor applied voltage and the motor current relative to the rotation number of the drive motor, fails to fall within a predetermined range.

It is to be noted that the wording "non-traveling time of the vehicle in which the electric power supply of the vehicle is applied" referred to above should be understood as meaning a condition, such as observed during a period of a startup time ranging from the time, at which an operator gets on the vehicle, to the start of traveling of the vehicle, in which although an electric power supply is applied to a control unit such as, for example, an ECU 21 used to control the entirety of the vehicle by means of, for example, a key, an electric power supply to the motor 6 has not yet been initiated or although no electric power supply is effected to the motor 6 for the purpose of stopping the vehicle, the electric power supply to a unit for controlling the entirety of the vehicle is kept applied.

According to the above described construction, during the non-traveling time in which the electric power supply of the vehicle is applied, the occurrence of the abnormality in the motor coil 78 is detected by the start-up abnormality detection section 98. In other words, the coil temperature and the coil resistance or the insulation resistance are detected, and, in the event that the coil temperature is greater than the threshold value or the coil resistance or the insulation resistance is greater than the threshold value, the occurrence of the abnormality in the motor coil 78 is detected. By way of example, in the event of the occurrence of an abnormality such as, for example, an insulation degradation or others, the coil temperature is greater than the threshold value or the coil resistance or the insulation resistance is greater than the threshold value. In the event that during the runup prior to, for example, the vehicle being driven, as one of check items during an abnormality checking of the vehicle in its entirety of, for example, the oil system or the like prior to the vehicle being driven, or during the halt subsequent to the vehicle having been started traveling, the occurrence of the abnormality in the motor 6 is diagnosed and the abnormality is determined as occurring in the motor 6, it is possible to be directed for, for example, a repair of the motor 6 or the like or, alternatively, a support for this vehicle can be requested.

During the traveling of the vehicle, the occurrence of the abnormality in the motor coil 78 is determined by the travel abnormality detection section 99. In other words, the coil temperature and the rotation numbers of the drive motor and the motor applied voltage and the motor current are detected and, in the event that the coil temperature is greater than the threshold value or the relation between the motor applied voltage and the motor current relative to the rotation numbers of the drive motor fails to fall within the predetermined range, the occurrence of the abnormality in the motor coil 78 is detected. During the traveling of the vehicle, the drive motor 6 is being rotated. During this motor rotation, for example, in the event of the occurrence of a shortcircuiting abnormality in the motor coil 78, the motor current fails to fall within the predetermined range and hence becomes abnormally high relative to the motor applied voltage. Also, since the counter electromotive force acts on the motor applied voltage in dependence on the rotation numbers of the drive motor, the relation between the motor applied voltage and the motor current often changes from time to time in dependence on the rotation numbers of the drive motor. Accordingly, by detecting at all times the relation between the motor applied voltage and the motor current, which corresponds to the rotation numbers of the drive motor, the occurrence of the abnormality in the motor coil 78 can be detected. In this way, not only during the traveling of the vehicle, but also during the non-traveling time of the vehicle, the occurrence of the abnormality in the motor coil 78 can be detected and the reliability of the electric vehicle can be increased. Also, a countermeasure against the motor abnormality can be quickly taken.

The start-up abnormality detection section 98 may be operable to detect the coil temperature and the coil resistance and then to detect the occurrence of the abnormality in the motor coil 78 in the event that the coil temperature is greater than the threshold value or the coil resistance is greater than the threshold value.

Alternatively, the start-up abnormality detection section 98 may be operable to detect the coil temperature and the insulation resistance and then to detect the occurrence of the abnormality in the motor coil 78 in the event that the coil temperature is greater than the threshold value or the insulation resistance is greater than the threshold value.

When a unit to drive the drive motor 6 includes an inverter 31 to convert a direct current power into an alternating current power that is used in driving the drive motor 6, provision may be made of a switch element 101 to selectively open and close an electric connection between the drive motor 6 and the inverter 31 and the start-up abnormality detection section 98 may be configured to open the switch element 101 to sequentially apply a voltage to the motor coil 78 of each phase and then to measure the coil resistance of the motor coil 78 of each phase from a measured value of an electric current of the motor coil 78 of each phase to which the voltage is applied. When during the non-traveling time in which the electric power supply of the vehicle is applied, the switch element 101 is opened, the electric current flowing through semiconductor switching elements and others of the inverter 31 is interrupted and, therefore, the electric current of the motor coil 78 of each phase to which the voltage has been applied can be accurately measured. From this measured value, it is possible to measure the coil resistance of the motor coil 78 of each phase. It is to be noted that during the traveling time, the switch element 101 is closed to allow the electric current to flow from the inverter 31 through the drive motor 6.

A unit to drive the drive motor 6 may include an inverter 31 for converting a direct current power into an alternating current power used in driving the drive motor 6, in which case the start-up abnormality detection section 98 is configured to sequentially apply a voltage to the motor coil 78 of each phase and then to measure the coil resistance of the motor coil 78 of each phase from a measured value of an electric current of the motor coil 78 of each phase to which the voltage is applied. At the time the coil resistance is measured, for example, the voltage is applied to an electric contact point between the motor coil 78 of each phase of the motor 6 and the inverter 31 and, from the measured value of the electric current between their electric contact points, the coil resistance of the motor coil 78 of each phase can be measured. In this case, the use of the switch element for switching the electric connection between the motor 6 and the inverter 31 can be dispensed with and the structure of the device can therefore be simplified.

Provision may be made of a thermister 103 positioned proximate to the motor coil 78, in which case the start-up abnormality detection section 98 includes a correction block 104 to correct the measured coil resistance in accordance with a coil temperature outputted from the thermister 103. By correcting the coil resistance in dependence on the coil temperature in this way, the occurrence of the abnormality in the drive motor 6 during the non-traveling time can be further accurately detected.

The motor 6 may be provided in each of wheels 2 which are drive wheels. The motor 6 may be partly or entirely disposed within the wheel 2 and forms an in-wheel motor drive system 8 including the motor 6, a wheel bearing assembly 4 and a reducer 7. In the case of the in-wheel motor drive system 8, as a result of downsizing, the wheel bearing assembly 4, the reducer 7 and the motor 6 are designed to rotate at a high speed and, therefore, securement of the reliability of them is of an important concern. Since during the non-traveling time of the vehicle the occurrence of the abnormality in the motor coil 78 is detected by the start-up abnormality detection section 98 and during the traveling of the vehicle the occurrence of the abnormality in the motor coil 78 can be detected by the travel abnormality detection section 99, the reliability of the motor 6 can be further enhanced.

The reducer 7 may be a cycloid reducer to reduce the rotation of the motor 6. Where the reducer 7 is employed in the form of a cycloid reducer and the reduction ratio is set to a value higher than, for example, 1/6, the motor 6 can be downsized and downsizing of the device can be achieved. Since when the driving torque of the motor 6 is transmitted to the wheel through the reducer 7 having such a high reduction ratio as discussed above such driving torque can be transmitted to the wheel after having been amplified, influences resulting from the motor abnormality will become conspicuous, but the occurrence of the abnormality in the motor coil 78 can be detected during the non-traveling time of the vehicle by the start-up abnormality detection section 98 at the stage prior to the vehicle traveling actually. For this reason, the detection of the occurrence of the abnormality will become effective. It is to be noted that if during the non-traveling time of the vehicle the occurrence of the abnormality were not detected, the occurrence of the abnormality in the motor coil 78 could be detected by the travel abnormality detection section 99 during the traveling of the vehicle.

The electric vehicle of the present invention may be so structured as to be driven by any one of the previously described drive motors 6.

The diagnostic method of diagnosing a drive motor in an electric vehicle according to the present invention is a diagnostic method of diagnosing the motor 6 employed in the electric vehicle of a type having a wheel 2 driven by the motor 6, which method includes a startup time abnormality detecting step of detecting a coil temperature of a motor coil 78 and a coil resistance or an insulation resistance of the motor coil 78 during a non-traveling time, in which an electric power supply of a vehicle is applied, and then of detecting the occurrence of an abnormality in the motor coil 78 in the event that the coil temperature is greater than a threshold value or the coil resistance or the insulation resistance is greater than a threshold value, and a non-traveling time abnormality detecting step of detecting the coil temperature and the rotation numbers of the motor and the motor applied voltage and the motor current during a non traveling time of the vehicle and then of detecting the occurrence of the abnormality in the motor coil 78 in the event that the coil temperature is greater than a threshold value, or a relation between the motor applied voltage and the motor current relative to the rotation number of the drive motor, fails to fall within a predetermined range.

According to the above described construction, in the practice of the startup time abnormality detecting step, the occurrence of the abnormality in the motor coil 78 is detected during the non-traveling time in which the electric power supply of the vehicle is applied. That is to say, in the event that the coil temperature is greater than the threshold value or the coil resistance or the insulation resistance is greater than the threshold value, the occurrence of the abnormality in the motor coil 78 is detected. On the other hand, in the practice of the traveling time abnormality detecting step, in the event that the coil temperature is greater than the threshold value or the relation between the motor applied voltage and the motor current relative to the rotation numbers of the motor, fails to fall within the predetermined range, the occurrence of the abnormality in the motor coil 78 is detected. In this way, not only during the traveling of the vehicle but also during the non-traveling time of the vehicle the occurrence of the motor coil 78 can be detected and the reliability of the electric vehicle is therefore increased. Also, a countermeasure against the motor abnormality can be quickly taken.

Any combination of at least two constructions, disclosed in the appended claims and/or the specification and/or the accompanying drawings should be construed as included within the scope of the present invention. In particular, any combination of two or more of the appended claims should be equally construed as included within the scope of the present invention.

BRIEF DESCRIPTION OF THE DRAWINGS

In any event, the present invention will become more clearly understood from the following description of embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DESCRIPTION OF EMBODIMENTS

Figure 1:
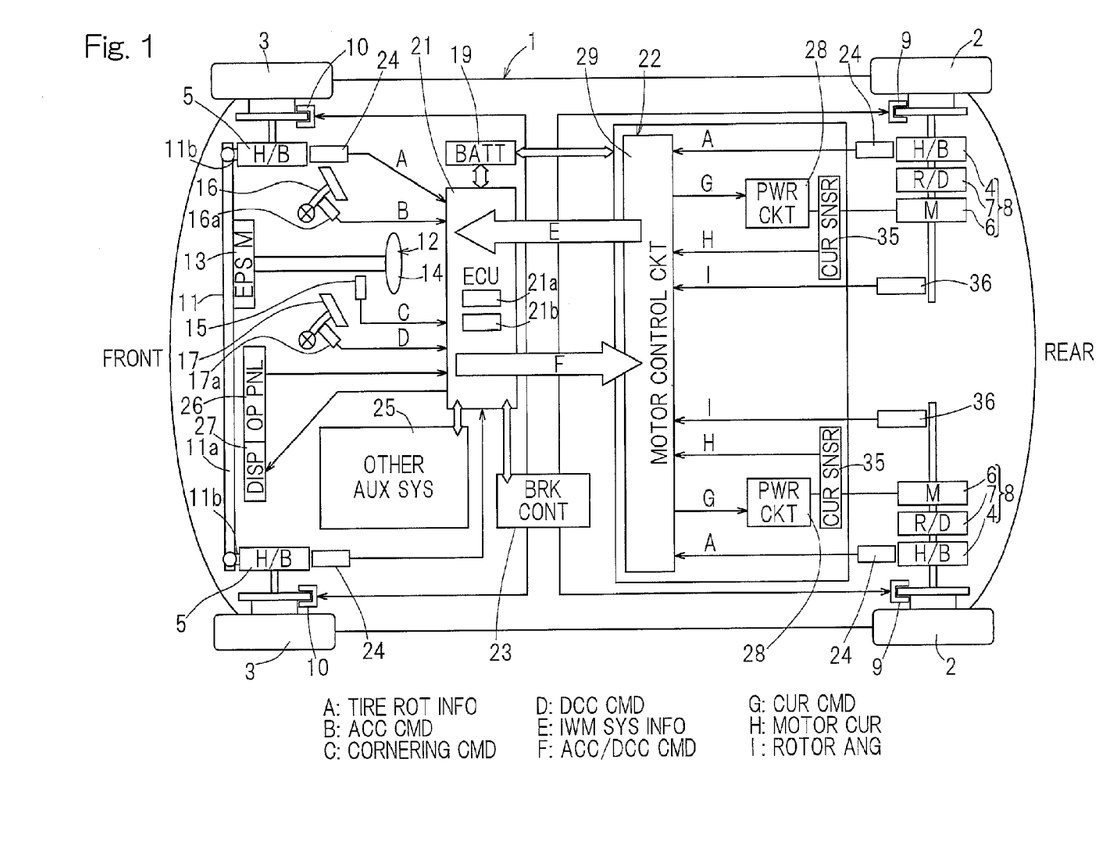
FIG. 1 is a block diagram showing a conceptual construction of an electric vehicle, shown in a top plan view, which vehicle designed in accordance with a first embodiment of the present invention.
Figure 2:
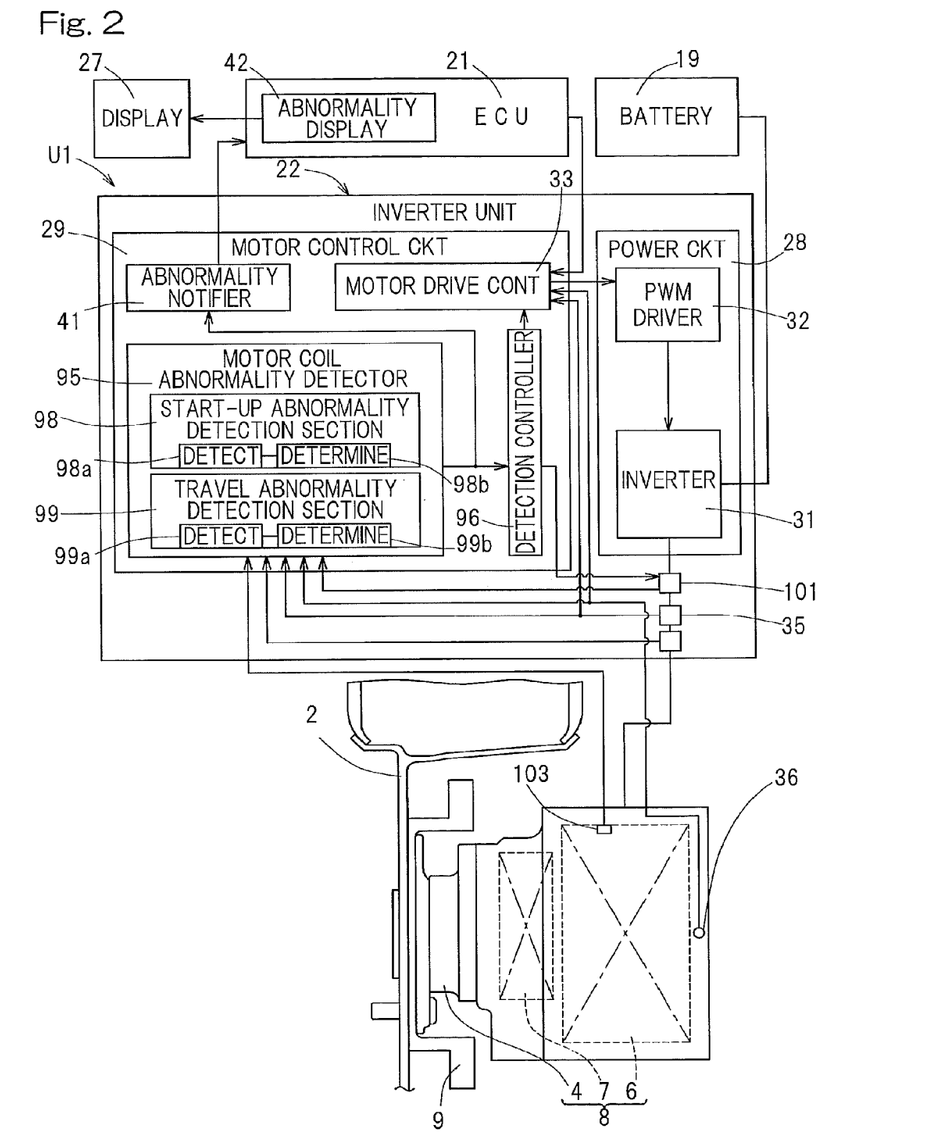
FIG. 2 is a block diagram showing a conceptual construction of the apparatus for diagnosing a drive motor for an electric vehicle.

A diagnostic apparatus for a drive motor and a diagnostic method, both used in an electric vehicle, which are designed in accordance with a first embodiment of the present invention will be described with particular reference to FIGS. 1 to 9. The diagnostic apparatus for the drive motor is mounted on the electric vehicle. This electric vehicle is a four wheeled vehicle of a type in which as shown in FIG. 1, wheels 2, which serve as respective rear wheels 2 on left and right sides of a vehicle body 1, are designed to be respective drive wheels and wheels 3, which serve as respective front wheels 3 on the left and right sides of the vehicle body 1, are designed to be respective steering wheels for driven wheels. Each of those wheels 2 and 3, which are designed as the drive and driven wheels, has a tire and supported by the vehicle body 1 through a respective wheel bearing assembly 4, 5. The wheel bearing assembly 4, 5 shown in FIG. 1 is indicated by "H/B" that is an abbreviation denoting a hub bearing. The left and right wheels 2, 2, which are designed as the drive wheels, are driven by respective independent motors 6, 6 for driving. The rotation of the motor 6 is transmitted to the associated drive wheel 2 through a reducer 7 and the corresponding wheel bearing assembly 4. The motor 6, the reducer 7 and the wheel bearing assembly 4 cooperate with each other to form an in-wheel motor drive system 8 which is a single assembled component. As shown in FIG. 2, the in-wheel motor drive system 8 is disposed in part, or in its entirety, in each of the left and right drive wheels 2. In the illustrated embodiment, the wheel bearing assembly 4 and the reducer 7 in its entirety and a portion of the motor 6 are shown as overlapping the drive wheel 2, but the in-wheel motor drive system 8 in its entirety may be overlapped with the drive wheel 2. The in-wheel motor drive system 8 is also called an in-wheel motor unit. The motor 6 may be of a type rotatable to drive the corresponding wheel 2 directly and without the reducer 7 being intervened. Each of the wheels 2 and 3 is provided with an electrically operated brake 9 and 10.

The wheels 3 and 3, which are the steering wheels serving as the left and right front wheels, are capable of being turned through a turning mechanism 11 and are steered by a steering mechanism 12. The turning mechanism 11 is a mechanism for driving a tie rod 11a in either leftward or rightward direction to change angles of a left and right knuckle arms 11b that hold the corresponding wheel bearing assemblies 4, and in response to a command from the steering mechanism 12, an EPS (electrically powered steering) motor 13 is driven to cause movement of leftwards or rightwards through a rotary-linear motion translating mechanism (not shown). The steering angle is detected by a steering angle sensor 15 and an output from this sensor is supplied to an ECU 21 and its information is used in, for example, acceleration or deceleration command for the left and right wheels.

A control system will now be described in detail. As shown in FIG. 2, a control device UI includes the ECU 21, which is electric control unit for performing a general control of the vehicle, and an inverter unit 22 for performing a control of the motor 6 for driving purpose in accordance with a command fed from the ECU 21. The ECU 21, the inverter unit 22 and a brake controller 23 are mounted on the vehicle body 1. The ECU 21 is made up of a computer, a program executable by such computer, various electronic circuits and others.

The ECU 21 may be generally divided, based on the function, into a drive control section 21a and a general control section 21b. The drive control section 21a generates from an acceleration command outputted by an accelerator operating unit 16, a deceleration command outputted by a brake operating unit 17 and a turning command outputted by a steering angle sensor 15, acceleration/deceleration commands to be applied to the motors 6 and 6 for driving purpose in the left and right wheels and then outputs them to the inverter unit 22. This drive control section 21a referred to above may have, in addition to the above, a function of correcting the acceleration/deceleration commands to be outputted, with the use of information on the number of revolutions of the tire, which is obtained from a rotation sensor 24 provided in each of the wheel support bearing assemblies 4 and 5 for the wheels 2 and 3, and information of each of vehicle mounted sensors. The accelerator operating unit 16 is comprised of an accelerator pedal and a sensor 16a for outputting the acceleration command by detecting the amount of depression of the accelerator pedal. The brake operating unit 17 is comprised of a brake pedal and a sensor 17a for outputting the deceleration command by detecting the amount of depression of the brake pedal.

The general control section 21b of the ECU 21 has a function of outputting a deceleration command, which is outputted from the brake operating unit 17, to the brake controller 23, a function of controlling various auxiliary systems 25, a function of processing an input command from an operating panel 26 of a console, a function of displaying on a display 27 and others. The auxiliary systems 25 referred to above includes, for example, an air conditioner, a light, a wiper, a GPS, air bags and others, but all of them are shown as a single block here.

The brake controller 23 provides braking commands to brakes 9 and 10 of the respective wheels 2 and 3 in accordance with the deceleration command outputted from the ECU 21. The braking commands outputted from the ECU 21 includes, in addition to a command generated by the deceleration command outputted by the brake operating unit 17, a command generated by a unit possessed by the ECU 21 for improving the safety. The brake controller 23 includes, in addition to that, an anti-lock brake system. This brake controller 23 is comprised of an electronic circuit, a microcomputer and others.

The inverter unit 22 includes a power circuit unit 28 provided for each of the motors 6 and a motor control circuitry 29 for controlling the power circuit unit 28. The motor control circuitry 29, although provided either in common or separately relative to each power circuit unit 28, is rendered to independently control the power circuit units 28 so as to differentiate, for example, motor torques from each other. The motor control circuitry 29 has a function of outputting to the ECU 21, various pieces of information (hereinafter, referred to as "IWM system information") on various detection values, control values and others which are possessed by the motor control circuitry 29 and are related to the in-wheel motor drive system 8.

FIG. 2 illustrates a block diagram showing a conceptual construction of the diagnostic apparatus for the drive motor used in the electric vehicle of the type discussed above. The power circuit unit 28 includes an inverter 31 for converting a direct current power of a battery 19 into a three phase alternating current power used in driving the motor 6 and a PWM driver 32 for controlling the inverter 31. The motor 6 is employed in the form of a three phase synchronous motor or the like. The inverter 31 referred to above is comprised of a plurality of semiconductor switching elements (not shown) and the PWM driver 32 performs a pulse width modulation of a current command inputted and applies ON/OFF commands to each of the semiconductor switching elements.

The motor control circuitry 29 is comprised of a computer, a program executable by the computer, electro circuits and others and makes use of a motor drive controller 33 as a main control unit forming the basis thereof. The motor drive controller 33 converts into an current command in accordance with an acceleration/deceleration command resulting from a torque command or the like, that is applied from the electric control unit which is a host control unit, and then applies the current command to the PWM driver 32 of the power circuit unit 28. The motor drive controller 33 performs a current feedback control after a motor current value to be supplied from the inverter 31 to the motor 6 has been received from a current detection element 35. Also, the motor drive controller 33, after having received the rotation angle of a rotor of the motor 6 from an angle sensor 36, performs a control such as, for example, a vector control or the like that is appropriate to the rotation angle.

The motor diagnostic apparatus will now be described. In the embodiment discussed hereinabove, the motor control circuitry 29 of the structure hereinbefore described is provided with a following motor coil abnormality detector 95, a controller 96 for detection purpose, an abnormality notifier 41 and a switch element 101 and an abnormality display 42 is provided in the ECU 21. The motor diagnostic apparatus according to this embodiment includes the motor coil abnormality 95, the controller 96 for detection purpose, the abnormality notifier 41, the switch element 101 and the abnormality display 42. The motor coil abnormality detector 95 in turn includes a start-up abnormality detection section 98 and a travel abnormality detection section 99.

To begin with, the start-up abnormality detection section 98 will be discussed. This start-up abnormality detection section 98 includes a detection block 98a and a determination block 98b. In this example, the detection block 98a is configured to detect a coil temperature of a motor coil and the coil resistance or insulation resistance of the motor coil during a non-traveling time of the vehicle in which an electric power supply of the vehicle is applied. It is to be noted that the wording "non-traveling time of the vehicle in which the electric power supply of the vehicle is applied" referred to above means a condition in which the electric power supply is applied to the ECU 21 of the electric vehicle while the vehicle is completely stopped and, hence, is intended to include, for example, (1) the occasion when a operator or the like operates a starting device such as, for example, a start button or the like from an OFF state to an "accessory power source" position prior to the electric power being supplied to the motor 6, whereby the ECU 21 is switched on or (2) the occasion when although the starting device is manipulated to an "ON" position while the ECU 21 has been in an ON state, the ECU 21 has not yet generated the acceleration command to be applied to the motor 6 and when a vehicle stopped condition is determined from information on the rotation number of a tire, obtained from the rotation sensor 24 and/or pieces of other information from vehicle mounted sensors, but excluding the occasion when, although the ECU 21 is switched on as a result of the flow of a very small electric current, a security system of the vehicle is turned on to establish a locked condition with no driver or the like getting on the vehicle.

When the starting device is brought into the "accessory power source" or "ON" position, the ECU 21 is determined as switched on. When the ECU 21 is determined as switched on and the power supply to the motor 6 is determined as having not yet taken place from the motor current from the current detection element 35 or the information on the rotation number of the tire, obtained from the rotation sensor 24 and/or pieces of other information from vehicle mounted sensors, it is determined as the non-traveling time of the vehicle in which no electric power of the vehicle has not yet been applied. The determination block 98b referred to above determines the occurrence of an abnormality in the motor coil in the event that the coil temperature detected by the detection block 98a is greater than a threshold value or when the coil resistance or the insulation resistance is greater than a threshold value.

Figure 3:
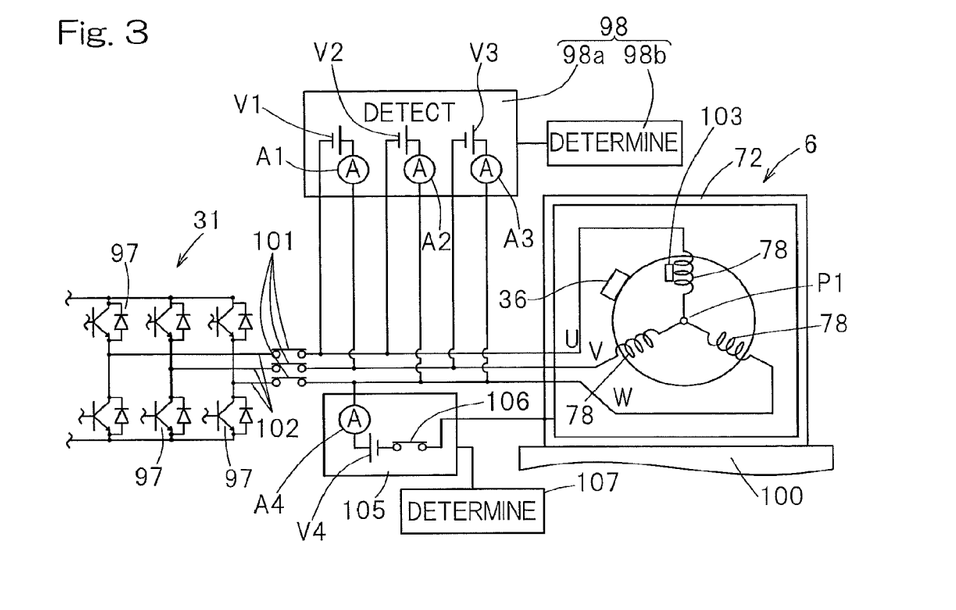
FIG. 3 is a schematic diagram showing an example of a circuit construction of an important portion of the diagnostic apparatus.
Figure 4:
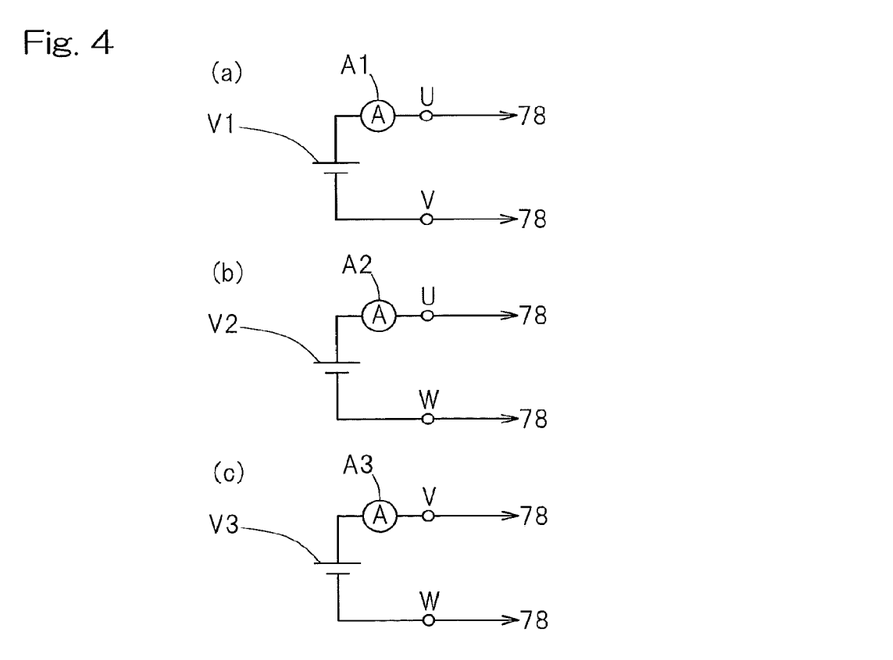
FIG. 4 shows diagrams (a) to (c) illustrating respective examples of detection of a coil resistance in a start-up abnormality detection section employed in the diagnostic apparatus.

Reference is now made to FIG. 3, which illustrates a schematic diagram showing an example of a circuit construction of an important portion of the diagnostic apparatus for the drive motor 6, and also to diagrams (a) to (c) of FIG. 4 which illustrate respective diagrams showing examples of detection of the coil resistance by the start-up abnormality detection section 98 of the diagnostic apparatus. As shown in FIG. 3, a motor housing 72 for the motor 6 is fixed to a knuckle 100 of the vehicle. This motor 6 is a synchronous motor of a type in which three phase motor coils 78 have connected in a star connection fashion with their adjacent ends joined together at a neutral point P1. The switch element 101 is provided for selectively opening and closing the electric connection between the motor 6 and the inverter 31. In other words, other ends of the three phase (U, V and W phases) motor coils 78 are connected through relays, which are switch elements 101, with respective internal wirings 102, one for each phase, that are connected with driving elements 97 such as, for example, switching transistors and others of the inverter 31.

Each of the relays referred to above is employed in the form of a so-called normally closed relay in which all of the three relay contacts are closed. The start-up abnormality detection section 98 commands the controller 96 for detection purpose (FIG. 2) so that during the non-traveling time of the vehicle in which the electric power supply of the vehicle is applied, all of the three relay contact should be opened. When the starting device such as, for example, a key or the like is held at the "accessory power source" or "ON" position, the ECU 21 is determined as switched on and, also, when it is determined from the motor current and others from the current detection element 35 that no power supply to the motor 6 is effected, the vehicle is determined as held in the non-traveling time of the vehicle with the electric power of the vehicle applied. When all of the three relay contacts are opened, the detection block 98a of the start-up abnormality detection section 98 sequentially switch the motor coils 78 of each phase to apply voltage and measures the coil resistance of the motor coil 78 of each phase.

As shown in FIG. 3, by way of example, the detection block 98a of the start-up abnormality detection section 98 is provided with electric power sources V1, V2 and V3 for measuring purpose, which are provided between electrodes of the respective U, V and W phases, and current sensors A1, A2 and A3. Those electric power sources V1 to V3 for measuring purpose and the current sensors A1 to A3 are electrically connected with, for example, respective wirings of each phase that extend from a motor housing 72 to respective contacts of the switch elements 101.

As shown in diagram (a) of FIG. 4, an electric voltage is applied by the electric power source V1 for measurement between the respective electrodes of the U and V phases and a value of the electric current of the motor coils 78 and 78 of the U and V phases is measured by the current sensor A1. Hereinafter, as shown in diagram (b) of FIG. 4, an electric voltage is applied by the electric power source V2 for measurement between the respective electrodes of the U and W phases and a value of the electric current of the motor coils 78 and 78 of the U and W phases is measured by the current sensor A2 and, as shown in diagram (c) of FIG. 4, an electric voltage is applied by the electric power source V3 for measurement between the respective electrodes of the V and W phases and a value of the electric current of the motor coils 78 and 78 of the V and W phases is measured by the current sensor A3. The determination block 98b of the start-up abnormality detection section 98 determines the occurrence of an abnormality in the motor coil 78 in the event that the detected coil resistance is greater than a threshold value. It is to be noted that in the example shown in FIG. 3, in the motor 6 only one motor coil 78 is shown for each of the phases, but where the motor coil 78 for each of the phase is comprised of coils of a plurality of electrodes that are disposed in a circumferential direction, that in which the coils of those electrodes are connected parallel to or in series with each other for each phase becomes one motor coil 78 shown in FIG. 1.

Also, as shown in FIG. 3, the detection block 105 is capable of closing a relay 106, applying a predetermined electric voltage between the motor coil 78 and a motor casing 72 by means of an electric power source V4 for measuring purpose, and measuring an electric current flowing therebetween, by means of a current sensor A4 to thereby measure the insulation resistance between the motor coil 78 and the motor casing 72. The determination block 107 referred to above determines whether or not the measured insulation resistance is greater than a threshold value. In FIG. 3, the detection block 105 is connected with the W phase of the motor coil 78, but it may be connected with the U phase or the V phase.

As shown in FIG. 3, as a temperature sensor for detecting the coil temperature of the motor coil 78, a thermister 103, for example, may be used. With this thermister 103 fixed to the motor coil 78, the temperature of the motor coil 78 can be detected. In the detection block 98a, for example, a value detected by the thermister 103 is amplified by an amplifier not shown, and this amplified value is determined by the determining subunit 98b as to whether or not it is greater than a threshold value. In the illustrated example, the thermister 103 is fixed to the motor coil 78 to detect the coil temperature, but the thermister 103 may be provided, without being fixed to the motor coil 78, at a position proximate to the motor coil 78 such that the thermister 103 may detect the coil temperature. Also, the temperature of each of the coils connected with the U, V and W phases may be measured individually by the thermister 103.

Also, although in the example shown in and described with reference to FIG. 3 the relays 101 are employed so that the respective resistances of the coils are measured during the non-traveling time of the vehicle, in which the electric power supply of the vehicle is applied, with all of the three relay contacts opened, the relay need not be necessarily employed. In such case, the resistance of the coil, when the motor coil 78 is in a normal condition, is measured.

Each of the threshold values will be discussed in detail. As previously described, in the determination block 98b, the occurrence of the abnormality in the motor coil 78 is determined when the coil resistance and the isolation resistance are greater than the respective threshold values. In this case, by means of, for example, a series of experiments and/or simulations, relations between the applied voltages and the current values in a normal condition, in which such abnormality as, for example, insulation degradation or the like in the motor coil 78 has not yet occurred, are stored as reference values. A value that includes a measurement error and others in addition to a current value that resulted in the insulation degradation relative to the specific applied voltage is set to be a threshold value for use in the determination of the coil resistance or the insulation resistance.

Also, in the determination block 98b, the occurrence of the abnormality is determined in the event that the coil temperature is greater than the threshold value. In this case, by means of a series of experiments and/or simulations, relations between the applied voltages, the coil temperature and the applied time period in a normal condition of the motor coil 78 are stored as reference values. When the specific voltage is applied to the motor coil 78 for a predetermined length of time period, the coil temperature in the normal condition is uniquely determined. If the coil temperature measured in such case is higher by $\alpha$ ($\alpha$ being, for example, 10-odd % or higher) than the reference value, it is assumed that an overload has occurred in the motor 6. The parameter "$\alpha$" referred to above is set to be a threshold value that is used in the determination of the coil temperature.

The travel abnormality detection section 99 will now be described. As shown in FIG. 2, the travel abnormality detection section 99 includes a detection block 99a and a determination block 99b. In this example, the detection block 99a detects the coil temperature, the rotation numbers of the motor, the motor applied voltage and the motor current during the travel of the vehicle. The "traveling time of the vehicle" referred to previously is determined when the ECU 21 is switched on and the supply of the electric power to the motor 6 is determined based on the information on the rotation numbers of the tire obtained from the rotation sensor 24 or the motor current value obtained from the current detection element 35. The determination block 99b referred to above determines the occurrence of the abnormality in the motor coil 78 when the coil temperature, detected by the detection block 99a, is greater than the threshold value or the relation between the motor applied voltage and the motor current relative to a rotation number of the motor fails to fall within a predetermined range.

The threshold value used in the determination of the coil temperature during the travel of the vehicle is determined in a manner similar to that described previously. In other words, the relation between the applied voltage, the coil temperature and the length of time period of application in the normal condition of the motor coil 78 is stored as a reference value and when the coil temperature at the time the specific voltage is applied to the motor coil for a predetermined length of time period is higher by $\alpha$ ($\alpha$ being, for example, 10-odd % or higher) than the reference value, it is determined that the overload occurs in the motor 6. The parameter $\alpha$ referred to above is set to be a threshold value used in the determination of the coil temperature. It is to be noted that at the time of detection and determination of the coil temperature, under a condition in which all of the three relay contacts have been closed, the specific voltage referred to above is applied to the motor coil 78.

Figure 5:
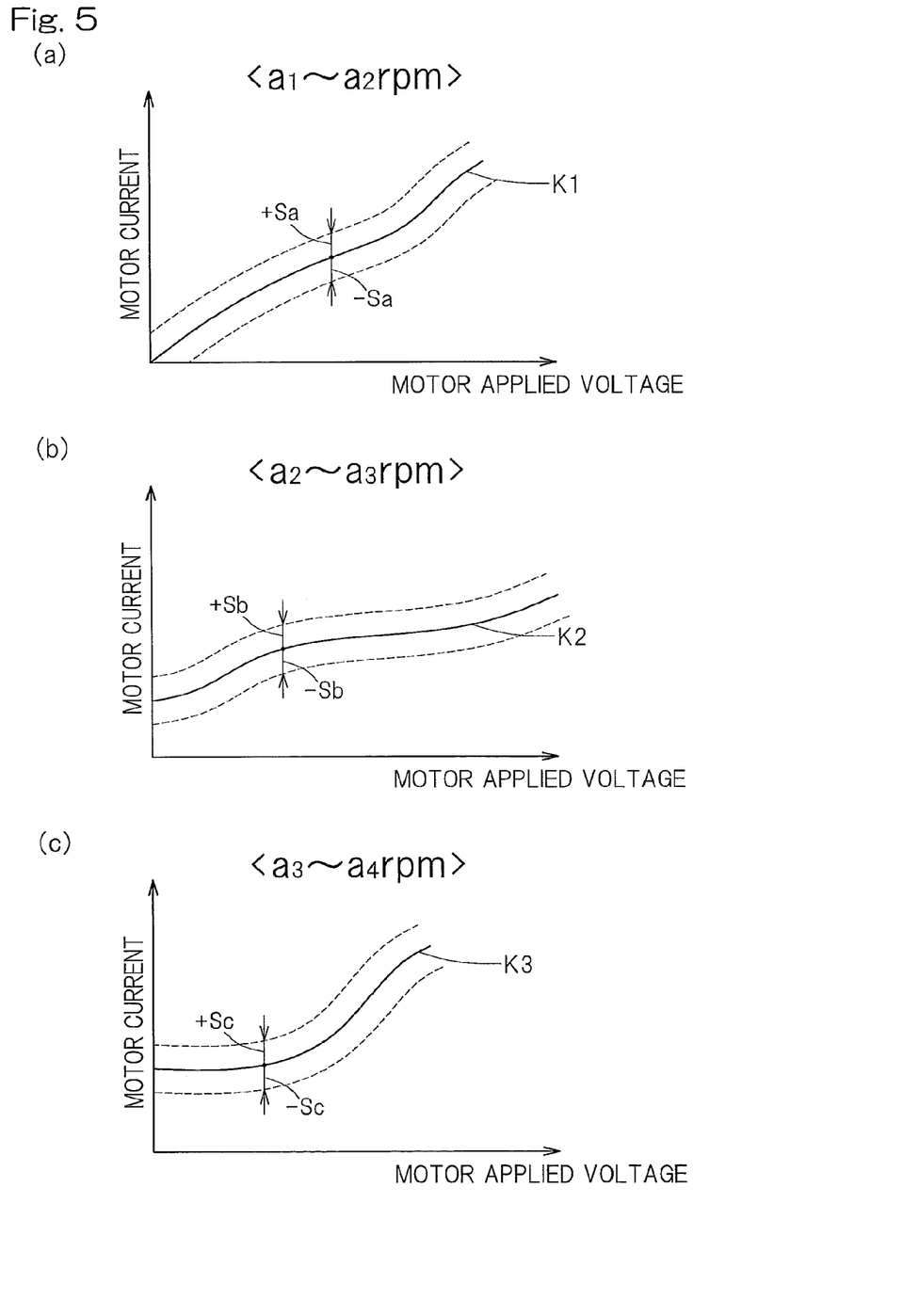
FIG. 5 shows charts (a) to (c) illustrating respective relations between a motor applied voltage and a motor current, which correspond to a motor rotational number, in a travel abnormality detection section employed in the diagnostic apparatus.

Various relations between the motor applied voltage and the motor current during the traveling of the vehicle are set relative to the rotation numbers of the motor. Charts (a) to (c) of FIG. 5 illustrate respective charts showing relations between the motor applied voltage and the motor current, which correspond to different numbers of rotations of the motor. In particular, chart (a) of FIG. 5 illustrates the relation between the motor applied voltage and the motor current when the rotation numbers of the motor is within the range of $a_1$ rpm to $a_2$ rpm. Assuming that the reference value in this case is expressed by K1, and if the rotation numbers of the motor is within the range of $a_1$ rpm to $a_2$ rpm, it is assumed that no overload occurs in the motor 6 when it is within a range of ±Sa (Sa being, for example, 10-odd %) relative to the reference value K1 at an arbitrarily chosen motor applied voltage. In other words, when the rotation numbers of the motor is within the range of $a_1$ rpm to $a_2$ rpm, the determination block 99b determines the occurrence of the abnormality in the motor coil 78 if it fails to fall within the range of the parameter ±Sa relative to the reference value K1.

In a manner similar to that described above, as shown in chart (b) of FIG. 5, the determination block 99b when the rotation numbers of the motor is within the range of $a_2$ rpm to $a_3$ rpm, determines the occurrence of the abnormality in the motor coil 78 if it fails to fall within the range of the parameter ±Sb relative to the reference value K2 that is different from the reference value K1. As shown in chart (c) of FIG. 5, the determination block 99b when the rotation numbers of the motor is within the range of $a_3$ rpm to $a_4$ rpm, determines the occurrence of the abnormality in the motor coil 78 if it fails to fall within the range of the parameter ±Sc relative to the reference value K3. The range of each of the parameters ±Sa, ±Sb and ±Sc is the previously described predetermined range. It is to be noted that in this example, the region of the rotation numbers of the motor is divided into three regions and the reference value and the predetermined range are defined for each of those three regions, the present invention is not necessarily limited thereto. By way of example, the region of the rotation numbers of the motor may be divided into two regions and the reference value and the predetermined range may then be determined for each of those two regions or, alternatively, the region of the rotation numbers of the motor may be divided into four or more regions and the reference value and the predetermined range may then be determined for each of those four or more regions.

Functions and effects will now be described. During the non-traveling time of the vehicle in which the electric power supply of the vehicle is applied or, more specifically, when the operator or the like manipulates a starting device such as, for example, a key or a start button or the like to be switched from the OFF state to the "accessory power source" position at which the auxiliary systems 25 such as, for example, a light, a wiper and others can be driven with the ECU 21 consequently switched on, the start-up abnormality detection section 98 becomes ready to detect the occurrence of the abnormality in the motor coil 78. After the travel of the vehicle as will be described later, when the ECU 21 does not generate the acceleration command to the motor 6 while the ECU 21 is kept switched on, and also when it is determined from the information on the rotation numbers of the tire, obtained from the rotation sensor 24, the information from the vehicle mounted sensors and other that the vehicle is held in the travel stopped condition, the start-up abnormality detection section 98 is operable to detect the occurrence of the abnormality in the motor coil 78.

The detection block 98*a* of the start-up abnormality detection section 98 detects the coil temperature and the coil resistance or the insulation resistance. The determination block 98*b* determines the occurrence of the abnormality in the motor coil 78 when the coil temperature is greater than the threshold value or the coil resistance or the isolation resistance is greater than the threshold value. By way of example, when the abnormality such as, for example, the insulation degradation of the motor coil 78 occurs, the coil temperature tends to exceed the threshold value or the coil resistance or the isolation resistance tends to exceed the threshold value. In the event that during the run-up period prior to the vehicle being driven, or, for example, as one of check items during an abnormality checking of the vehicle in its entirety of the oil system or the like prior to the vehicle being driven, during a stoppage subsequent to the vehicle having been started traveling, the occurrence of the abnormality in the motor 6 is diagnosed and the abnormality is determined as occurring in the motor 6, it is possible to be directed for, for example, a repair of the motor 6 or the like or, alternatively, a support for this vehicle can be requested.

During the travel of the vehicle, that is, when the ECU 21 is kept turned on and it is determined from the information on the rotation numbers of the tire, obtained from the rotation sensor 24, or the motor current from the current detection element 35 that the electric power supply to the motor 6 is being carried out, the travel abnormality detection section 99 becomes ready to determine the occurrence of the abnormality in the motor coil 78. The detection block 99*a* of this travel abnormality detection section 99 detects the coil temperature, the rotation numbers of the motor, the motor applied voltage and the motor current. The determination block 99*b* determines the occurrence of the abnormality in the motor coil 78 when the coil temperature is greater than the threshold value or when the relation between the motor applied voltage and the motor current relative to the rotation numbers of the motor fails to fall within the predetermined range. During the travel of the vehicle, the motor 6 undergoes rotation. During this rotation of the motor, when, for example, a shortcircuiting abnormality occurs in the motor coil 78, the motor current departs markedly from the predetermined range relative to the motor applied voltage and becomes abnormally high. Also, since a counter-electromotive force acts on the motor applied voltage in dependence on the rotation numbers of the motor, the relation between the motor applied voltage and the motor current changes from time to time in dependence on the rotation numbers of the motor. Accordingly, by detecting at all times the relation between the motor applied voltage and the motor current, which corresponds to the rotation number of the motor, it is possible to detect as the abnormality occurring in the motor coil 78.

As described hereinabove, during the traveling of the vehicle and also during the non-traveling time of the vehicle, the abnormality occurring in the motor coil 78 can be detected and the reliability of the electric vehicle can be increased. Also, any countermeasure to the motor abnormality can be quickly taken.

The controller 96 for detection purpose may be so designed that when the occurrence of the abnormality in the motor coil 78 is detected by the determination block 99*b* in the travel abnormality detection section 99, the power circuit unit 28 may be commanded through the motor drive controller 33 to reduce the current value of the motor 6. The reduction of the motor current may be reduced by a predetermined proportion (for example, a few %) relative to the current then prevailing or reduced by a predetermined value.

Since the motor coil abnormality detector 95 is provided in the motor control circuitry 29 of the inverter unit 22 and the occurrence of the abnormality in the motor coil is determined at a site proximate to the motor 6, it is advantageous in terms of wiring and a quick control can be performed as compared with that provided in the ECU 21 and any problem associated with the vehicle traveling can be quickly avoided. Also, a burden on the ECU 21 which becomes complicated as a result of a high-tech orientation can be relieved.

Since the ECU 21 generally controls the vehicle in its entirety, when the occurrence of the abnormality is detected by the motor coil abnormality detector 95, the vehicle as a whole can be properly controlled by the ECU 21 by outputting to the ECU 21 an abnormality notification representative of the presence of the abnormality in the motor coil 78. Also, the ECU 21 is a host controller to send a driving command to the inverter unit 22 and, after an emergency control by the inverter unit 22, a proper control of the subsequent drive can be accomplished by the ECU 21 as well.

Also, in the case of the in-wheel motor drive system 8, consequent upon downsizing, the wheel bearing assembly 4, the reducer 7 and the motor 6 are designed to rotate at a high speed and, therefore, securement of the reliability of them is of an important concern. Since during the non-traveling time of the vehicle the occurrence of the abnormality in the motor coil 78 may be determined by the start-up abnormality detection section 98 and during the traveling of the vehicle the occurrence of the abnormality in the motor coil 78 may be determined by the travel abnormality detection section 99, the reliability of the motor 6 can be further enhanced.

Where the reducer 7 employed in association with the in-wheel motor drive system 8 is employed in the form of a cycloid reducer and the reduction ratio is set to a value higher than, for example, 1/6, the motor 6 can be downsized and downsizing of the whole device can be achieved. Since when the driving torque of the motor 6 is transmitted to the wheel through the reducer 7 having such a high reduction ratio as discussed above such driving torque can be transmitted to the wheel after having been amplified, influences resulting from the motor abnormality will become conspicuous, but the occurrence of the abnormality in the motor coil 78 can be detected during the non-traveling time of the vehicle by the start-up abnormality detection section 98 at the stage prior to the vehicle traveling actually. For this reason, the detection of the occurrence of the abnormality will become effective. It is to be noted that if during the non-traveling time of the vehicle the occurrence of the abnormality were not detected, the occurrence of the abnormality in the motor coil 78 could be detected by the travel abnormality detection section 99 during the traveling of the vehicle.

Figure 6:
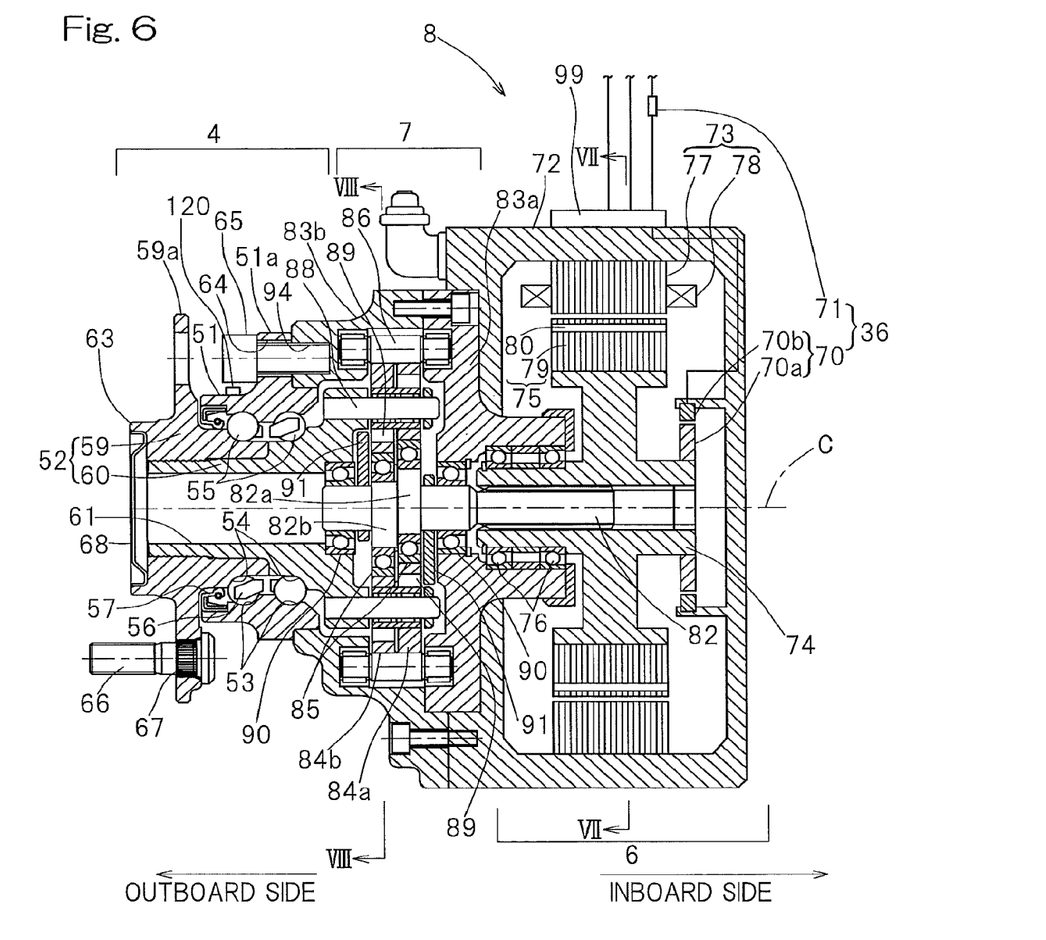
FIG. 6 is a front elevational view, with a portion cut out, of an in-wheel motor drive system employed in the electric vehicle.

As shown in FIG. 6 by way of example, the in-wheel motor drive system 8 is such that the reducer 7 is interposed between the wheel bearing assembly 4 and the motor 6 while a hub of the wheel 2, best shown in FIG. 2, which is the drive wheel supported by the wheel bearing assembly 4, and a rotary output shaft 74 of the motor 6, best shown in FIG. 6, are connected coaxially with each other. The reducer 7 is of a type desirably having a reduction ratio of 1/6 or higher. This reducer 7 is the cycloid reducer and is of a structure in which eccentric portions 82a and 82b are formed in a rotary input shaft 82 that is coaxially connected with the rotary output shaft 74 of the motor 6 and curved plate 84a and 84b are mounted respectively on the eccentric portions 82a and 82b through associated bearings 85, such that eccentric motions of the curved plates 84a and 84b can be transmitted as rotary motions to the wheel bearing assembly 4. It is to be noted that hereinafter in this specification, terms "outboard" and "inboard" represent one side of the vehicle body away from the longitudinal center of the vehicle body and the other side of the vehicle body close to the longitudinal center of the vehicle body, respectively, when assembled in the vehicle body.

The wheel bearing assembly 4 includes an outer member 51 having an inner periphery formed with a plurality of rolling surfaces 53, an inner member 52 having an outer periphery formed with rolling surfaces 54 in face to face relation with the rolling surfaces 53, and a plurality of rows of rolling elements 55 interposed between the respective rolling surfaces 53 and 54 of the inner and outer members 51 and 52. The inner member 52 concurrently serves as a hub to which the drive wheel is fitted. This wheel bearing assembly 4 is rendered to be a dual row angular contact ball bearing and the rolling elements 55 are employed in the form of balls that are retained by a retainer 56 for each row. Each of the rolling surfaces 53 and 54 is of an arcuate sectional shape and those rolling surfaces 53 and 54 are so formed as to assume a back-to-back relation to each other. A bearing space delimited between the outer member 51 and the inner member 52 has an outboard end sealed by a sealing member 57.

The outer member 51 serves as a stationary side raceway ring and is of one piece construction including a flange 51a that is fitted to a housing 83b on an outboard side of the reducer 7. The flange 51a is provided with a bolt insertion hole 64 at a plurality of locations in a circumferential direction. Also, the housing 83b is provided with a bolt threading hole 94 at respective positions corresponding to the bolt insertion holes 64, which hole 94 has an inner periphery formed with threads. When a mounting bolt 65, then having been inserted into the bolt insertion hole 94, is threaded in the bolt threading hole 94, the outer member 51 is fitted to the housing 83b.

The inner member 52 serves as a rotatable side raceway ring and includes an outboard side member 59, having a hub flange 59a for fitting to the vehicle, and an inboard side member 60 integrated together with the outboard side member 59 by mounting and crimping an outboard side of the inboard side member 60 to an inner periphery of the outboard side member 59. The rolling surfaces 54 of each row are formed in the outboard side member 59 and the inboard side member 60, respectively. The inboard side member 60 is provided at a center thereof with a throughhole 61. The hub flange 59a is provided with a press fitting hole 67 at a plurality of circumferential locations for receiving a corresponding hub bolt 66. In the vicinity of a root portion of the hub flange 59a of the outboard side member 59, a cylindrical pilot portion 63 protruding towards the outboard side for guiding the drive wheel and a brake component (not shown). This pilot portion 63 has an inner periphery to which a cap 68 for closing an outboard end of the throughhole 61 referred to above.

The motor 6 is in the form of an IPM motor (Interior Permanent Magnet synchronous motor) of a radial gap type in which a radial gap is formed between a motor stator 73, fixed to a cylindrical motor housing 72, and a motor rotor 75 fitted to the rotary output shaft 74. The rotary output shaft 74 is supported in a cantilever fashion by two bearings 76 within a tubular portion of the housing 83a on the inboard side of the reducer 7.

Figure 7:
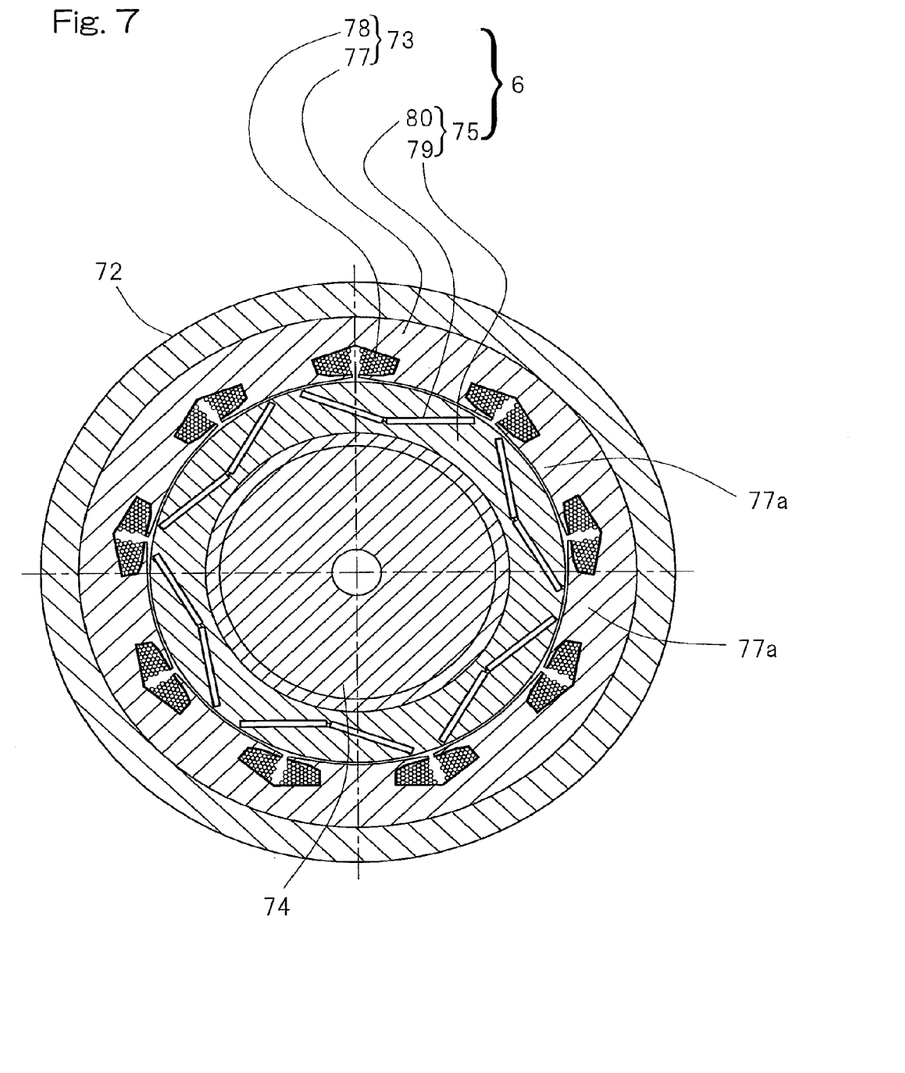
FIG. 7 is a sectional view of a motor portion, which is a cross sectional view taken along the line VII-VII in FIG. 6.

FIG. 7 illustrates a sectional view of the motor (a cross sectional view taken along the line VII-VII in FIG. 6). The rotor 75 of the motor 6 includes a core portion 79, made of a soft magnetic material, and a permanent magnet 80 built in the core portion 79. The permanent magnet 80 is of a structure in which neighboring two permanent magnet elements are arranged so as to represent a " " shaped pattern on the same circumference within the rotor core portion 79. The permanent magnet 80 is employed in the form of a neodymium based magnet. The stator 73 is comprised of a core portion 77, made of a soft magnetic material, and a coil 78. The core portion 77 is of a ring shape having its outer peripheral surface representing a round sectional shape, with a plurality of teeth 77a formed in an inner peripheral surface thereof so as to protrude radially inwardly and juxtaposed relative to each other in a circumferential direction thereof. The coil 78 is wound around each of the teeth 77a in the stator core portion 77.

As shown in FIG. 6, the motor 6 is provided with an angle sensor 36 for detecting the angle of relative rotations between the motor stator 73 and the motor rotor 75. This angle sensor 36 has a angle sensor main body 70 for detecting and outputting a signal descriptive of the angle of the relative rotations between the motor stator 73 and the motor rotor 75 and an angle calculating circuit 71 for calculating the angle from the signal outputted from the angle sensor main body 70. The angle sensor main body 70 is made up of the to-be-detected portion 70a, provided on an outer peripheral surface of the rotary output shaft 74, and a detecting portion 70b provided in the motor housing 72 and positioned at a location close to the to-be-detected portion 70a so as to face towards the latter in, for example, a radial direction. The to-be-detected portion 70a and the detecting portion 70b may be positioned close to each other so as to face in an axial direction. The angle sensor 36 may be a resolver. In order to maximize the efficiency of the motor 6, on the basis of the angle of the relative rotations between the motor stator 73 and the motor rotor 75, which is detected by the angle sensor 36, the timing at which each of the phases of each of waves of alternating currents to be supplied to the coil 78 of the motor stator 73 is so chosen as to be controlled by the motor drive controller 33 of the motor control circuitry 29.

It is to be noted that wirings for the motor current of the in-wheel motor drive system 8 and wiring for various sensor systems and command systems are bundled together by a connector 99 provided in, for example, the motor housing 72.

Figure 8:
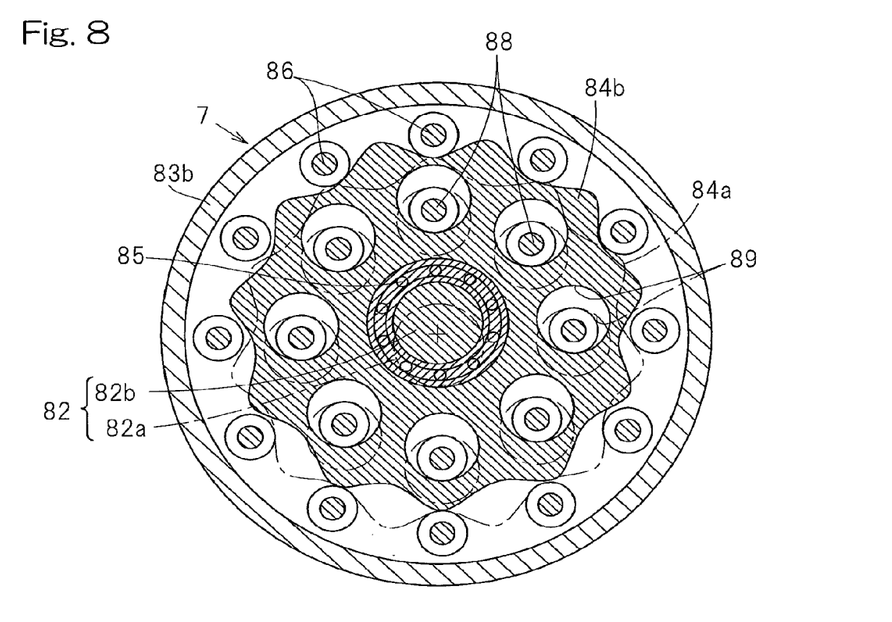
FIG. 8 is a sectional view of a reducer portion, which is a cross sectional view taken along the line VIII-VIII in FIG. 6.

The reducer 7 referred to above is the cycloid reducer as hereinbefore described and the two curved plates 84a and 84b, each having an outer contour formed according to a smoothly wavy trochoidal curve, are mounted on the eccentric portions 82a and 82b of the rotary input shaft 82 through the respective bearings 85. A plurality of outer pins 86 for guiding the eccentric motions of those curved plates 84a and 84b on an outer peripheral side are provided straddled in the housing 83b and a plurality of inner pins 88 fitted to the inboard side member 60 of the inner member 2 are engaged in an inserted fashion in a plurality of round throughholes 89 provided inside of the curved plates 84a and 84b. The rotary input shaft 82 is splined to the rotary output shaft 74 of the motor 6 for rotation together therewith. It is to be noted that the rotary input shaft 82 referred to above is supported at its opposite ends by the housing 83a on the inboard side and an inner diametric surface of the inboard side member 60 of the inner member 52 through two bearings 90.

When the output shaft 74 of the motor 6 rotates, the curved plates 84a and 84b fitted to the rotary input shaft 82 that rotates together therewith undergo the respective eccentric motions. Those eccentric motions of the curved plates 84a and 84b are transmitted as a rotary motion to the inner member 52 by means of the engagement between the inner pins 88 and the throughholes 89. The rotation of the inner member 52 becomes reduced relative to the rotation of the rotary output shaft 74. By way of example, with a cycloid reducer of one stage, the reduction ration of 1/10 or higher can be obtained.

The above described two curved plates 84a and 84b are mounted on the respective eccentric portions 82a and 82b of the rotary input shaft 82 having been displaced 180° relative to each other so that the eccentric motions can be counterbalanced, and on opposite sides of each of the eccentric portions 82a and 82b, a counterweight 91, which is made eccentric in a direction counter to the direction of eccentricity of the corresponding eccentric portion 82a and 82b, is mounted so that vibrations caused by the eccentric motion of the corresponding curved plate 84a or 84b can be counterbalanced.

Figure 9:
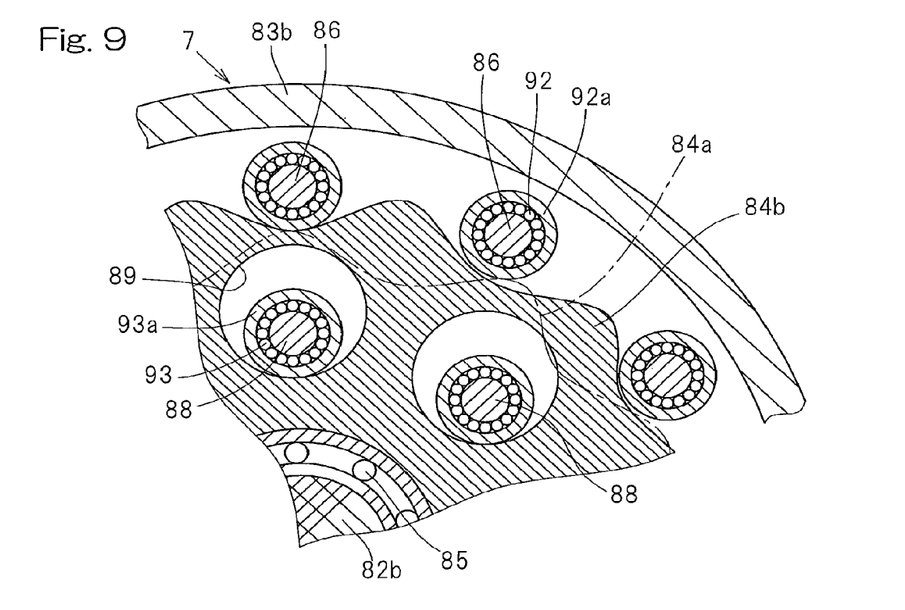
FIG. 9 is a fragmentary enlarged sectional view of FIG. 8.

As shown in FIG. 9 on an enlarged scale, bearings 92 and 93 are mounted on each of the outer pins 86 and each of the inner pins 88, respectively, and outer rings 92a and 93a of those bearings 92 and 93 are made to rollingly contact the outer peripheries of the curved plates 84a and 84b and the inner peripheries of the throughholes 89. Accordingly, the contact resistance between the outer pins 86 and the curved plates 84a and 84b and the contact resistance between the inner pins 88 and the throughholes 89 are reduced and the eccentric motions of the curved plates 84a and 84b can therefore be transmitted as the rotary motion smoothly to the inner member 52.

Referring to FIG. 6, the wheel bearing assembly 4 of the in-wheel motor drive system 8 is fixed to the vehicle body through a suspension device (shown in FIG. 3) such as, for example, a knuckle on an outer peripheral portion of the housing 83b of the reducer 7 or the housing 72 of the motor 6.

The start-up abnormality detection section 98 employed in the practice of the previously described first embodiment may be of a type such as described hereinafter. In other words, the start-up abnormality detection section 98 shown in FIG. 2 may be of a type capable of detecting the coil temperature and the coil resistance and then determining the occurrence of the abnormality in the motor coil 78 in the event that the coil temperature is greater than a threshold value or the coil resistance is greater than a threshold value. In this construction, arrangement may be made that in a condition in which the inverter 31 and the motor 6 are electrically connected with each other, the start-up abnormality detection section 98 applies a voltage sequentially to the motor coil 78 of each phase and, from a measured value of the current of the motor coil 78 of each phase to which the voltage has been applied, the coil resistance of the motor coil 78 of each phase is measured. At the time the coil resistance is measured, for example, a voltage is applied between electric contact points between the motor coil 78 of each phase of the motor 6 and the inverter 31 and from a measured value of the current between those electric contact points, the coil resistance of the motor coil 78 of each phase can be measured. In this case, the use of a switch element for switching the electric connection between the motor 6 and the inverter 31 can be dispensed with and the structure of the device can therefore be simplified.

Also, the start-up abnormality detection section 98 shown in FIG. 2 may be of a type which detects the coil temperature and the insulation resistance and then determines the occurrence of the abnormality in the motor coil 78 in the event that the coil temperature is greater than the threshold value or the insulation resistance is greater than a threshold value. The start-up abnormality detection section 98 referred to above may include a correction block for correcting the measured coil resistance in dependence on the coil temperature outputted by the thermister provided in the motor coil 78. As shown in FIG. 4, by sequentially applying the voltage to the motor coil 78 of each phase, the coil resistance of the motor coil 78 of each phase is measured from the measured value of the current of the motor coil 78 of each phase to which the voltage has been applied, but where restart is effected immediately after the vehicle has driven, as a result that the coil temperature is relatively high and is gradually lowered, the coil resistance in accordance with the coil temperature becomes smaller than the coil resistance during the startup time of the vehicle that has stopped for a long period of time.

Figure 10:
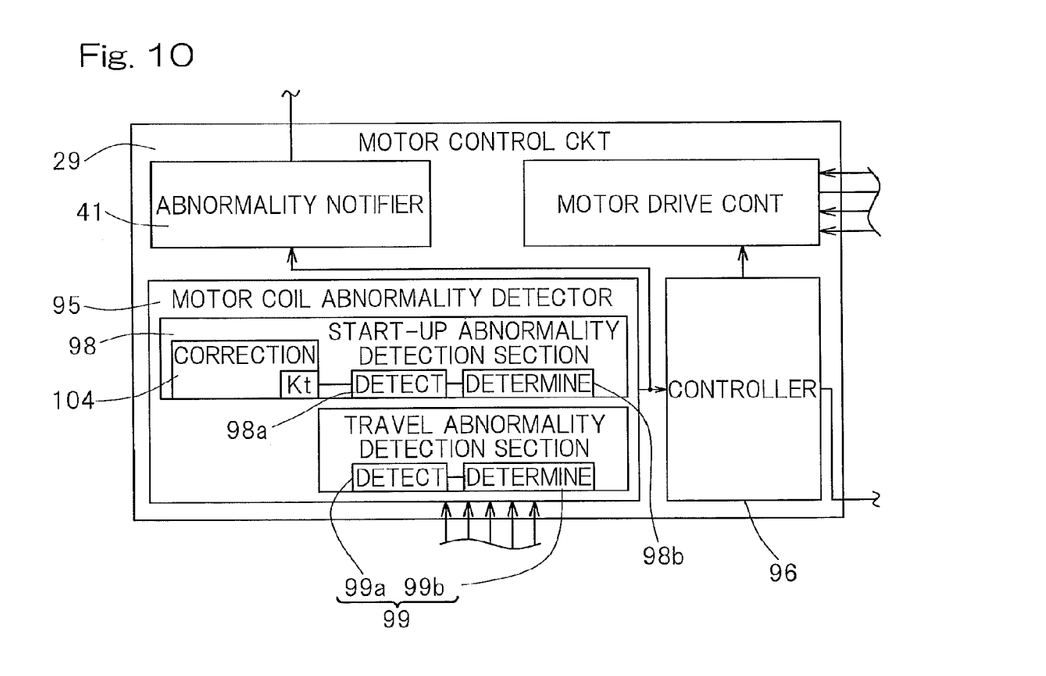
FIG. 10 is a block diagram showing an important portion of the conceptual construction of the diagnostic apparatus for the drive motor used in the electric vehicle, which is designed in accordance with a second embodiment of the present invention.

In view of the above, in a second embodiment shown in FIG. 10, in order to objectively determine the coil resistance that has been measured during the non-traveling time, the correction block 104 is provided in the start-up abnormality detection section 98. In this case, by means of a series of experiments, the coil resistance at the time the coil temperature is at a reference temperature (suitably determined temperature in the vicinity of normal temperature) and the coil resistance when the coil temperature elevates are determined. From a plurality of coil resistances so determined, a correction coefficient Kt used in the correction block 104 can be calculated. Accordingly, if in dependence on the coil temperature the coil resistance is corrected by multiplying by the correction coefficient Kt, the occurrence of the abnormality in the motor 6 during the non-traveling time can be further accurately detected. It is to be noted that the motor coil abnormality detector 95 may be provided in the ECU 21, which is an electric control unit for controlling the vehicle as a whole.

Although the present invention has been fully described in connection with the embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

REFERENCE NUMERALS 2, 3 . . . Wheel
4 . . . Wheel bearing assembly
6 . . . Motor
7 . . . Reducer
8 . . . In-wheel motor drive system
78 . . . Motor coil
31 . . . Inverter
98 . . . Start-up abnormality detection section
99 . . . Travel abnormality detection section
101 . . . Switch element
103 . . . Thermister
104 . . . Correction block

What is claimed is:

1. A diagnostic apparatus to diagnose a drive motor used in an electric vehicle that is driven by the motor, comprising:
a start-up abnormality detection section to detect a coil temperature of a motor coil and a coil resistance or an insulation resistance of the motor coil during a non-traveling time, in which an electric power supply of a vehicle is applied, and then to determine an occurrence of an abnormality in the motor coil in the event that the coil temperature is greater than a threshold value or the coil resistance or the insulation resistance is greater than a threshold value; and a travel abnormality detection section to detect the coil temperature, a rotation number of the motor, a motor applied voltage and a motor current during a traveling of the vehicle and then to determine an occurrence of the abnormality in the motor coil in the event that the coil temperature is greater than a threshold value, or a relation between the motor applied voltage and the motor current relative to the rotation numbers of the motor fails to fall within a predetermined range.

2. The diagnostic apparatus to diagnose the drive motor in the electric vehicle as claimed in claim 1, wherein the start-up abnormality detection section is configured to detect the coil temperature and the coil resistance and then to determine the occurrence of the abnormality in the motor coil in the event that the coil temperature is greater than the threshold value or the coil resistance is greater than the threshold value.

3. The diagnostic apparatus to diagnose the drive motor in the electric vehicle as claimed in claim 1, wherein the start-up abnormality detection section is configured to detect the coil temperature and the insulation resistance and then to determine the occurrence of the abnormality in the motor coil in the event that the coil temperature is greater than the threshold value or the insulation resistance is greater than the threshold value.

4. The diagnostic apparatus to diagnose the drive motor in the electric vehicle as claimed in claim 2, wherein a unit to drive the motor comprises an inverter to convert a direct current power into an alternating current power that is used in driving the motor and a switch element to selectively open and close an electric connection between the motor and the inverter; and wherein the start-up abnormality detection section is configured to open the switch element to sequentially apply a voltage and then to measure the coil resistance of the motor coil of each phase from a measured value of an electric current of the motor coil of each phase to which the voltage is applied.

5. The diagnostic apparatus to diagnose the drive motor in the electric vehicle as claimed in claim 2, wherein a unit to drive the motor comprises an inverter to convert a direct current power into an alternating current power that is used in driving the motor; and wherein the start-up abnormality detection section is configured to apply a voltage and then to measure the coil resistance of the motor coil of each phase from a measured value of an electric current of the motor coil of each phase to which the voltage is applied.

6. The diagnostic apparatus to diagnose the drive motor in the electric vehicle as claimed in claim 2, further comprising a thermister positioned proximate to the motor coil, wherein the start-up abnormality detection section includes a correction block to correct the measured coil resistance in accordance with a coil temperature outputted from the thermister.

7. The diagnostic apparatus to diagnose the drive motor in the electric vehicle as claimed in claim 1, wherein the drive motor is provided in each of wheels which are drive wheels.

8. The diagnostic apparatus to diagnose the drive motor in the electric vehicle as claimed in claim 7, wherein the motor forms an in-wheel motor drive system partly or entirely disposed within the wheel and comprising the drive motor, a wheel bearing assembly and a reducer.

9. The diagnostic apparatus to diagnose the drive motor in the electric vehicle as claimed in claim 8, wherein the reducer is a cycloid reducer to reduce the rotation of the drive motor.

10. An electric vehicle configured to be driven by the drive motor as defined in claim 1.

11. A diagnostic method of diagnosing a drive motor in an electric vehicle, comprising:

a start-up abnormality detection step to detect a coil temperature of a motor coil and a coil resistance or an insulation resistance of the motor coil during a non-traveling time, in which an electric power supply of a vehicle is applied, and then to determine an occurrence of an abnormality in the motor coil in the event that the coil temperature is greater than a threshold value or the coil resistance or the insulation resistance is greater than a threshold value; and a travel abnormality detection step to detect the coil temperature, a rotation number of the motor, a motor applied voltage and a motor current during a traveling of the vehicle and then to determine an occurrence of the abnormality in the motor coil in the event that the coil temperature is greater than a threshold value, or a relation between the motor applied voltage and the motor current relative to the rotation numbers of the motor fails to fall within a predetermined range.

* * * * *